(12) United States Patent
Nitta et al.

(10) Patent No.: US 7,409,309 B2
(45) Date of Patent: Aug. 5, 2008

(54) METHOD OF DECIDING THE QUALITY OF THE MEASUREMENT VALUE BY THE EDGE WIDTH

(75) Inventors: Jun Nitta, Tokyo (JP); Katuyuki Takahashi, Tokyo (JP); Norimichi Anazawa, Tokyo (JP)

(73) Assignee: Holon Co., Ltd., Tokyo (JP)

( * ) Notice: Subject to any disclaimer, the term of this patent is extended or adjusted under 35 U.S.C. 154(b) by 350 days.

(21) Appl. No.: 11/270,813

(22) Filed: Nov. 10, 2005

(65) Prior Publication Data
US 2006/0109486 A1    May 25, 2006

(30) Foreign Application Priority Data
Nov. 19, 2004 (JP) ............................. 2004-335740
Jul. 4, 2005 (JP) ............................. 2005-194819

(51) Int. Cl.
*G01B 11/02* (2006.01)
*G06F 17/00* (2006.01)

(52) U.S. Cl. .......................... 702/127; 702/81; 702/82; 702/170; 702/172; 356/635; 356/636

(58) Field of Classification Search ................ 702/127, 702/81, 82, 170, 172
See application file for complete search history.

(56) References Cited

U.S. PATENT DOCUMENTS

| 5,698,346 A | * | 12/1997 | Sugawara | 430/5 |
| 7,046,363 B2 | * | 5/2006 | Michaelis et al. | 356/445 |
| 2005/0221207 A1 | * | 10/2005 | Nagatomo et al. | 430/30 |
| 2006/0043292 A1 | * | 3/2006 | Matsui | 250/310 |

* cited by examiner

*Primary Examiner*—Hal D Wachsman
(74) *Attorney, Agent, or Firm*—Staas & Halsey LLP

(57) ABSTRACT

A method of deciding the quality of a measurement value of the line width, the line interval or the like of a pattern on an object to-be-measured, including acquiring the signal intensity distribution of the pattern on the object to-be-measured, detecting the edge positions of the pattern from the acquired signal intensity distribution, detecting the taper widths of the edge parts of the pattern from the acquired signal intensity distribution, and deciding that the measurement value calculated on the basis of the detected edge positions is correct, when the detected taper widths fall within a predetermined range set beforehand. In this way, it is permitted to automatically decide the defective measurement of the line width of the pattern, or the like, attributed to an unclear image due to inferior focusing in an image photographing mode, an unclear image due to an image drift ascribable to charging-up, or the like.

11 Claims, 11 Drawing Sheets (a-1) SECTION (a-2) SIGNAL INTENSITY DISTRIBUTION (a-3) VARIATION OF SIGNAL DISTRIBUTION ATTRIBUTED TO DEFOCUSING $$xe = \frac{xp_1 - xp_2}{2}$$

Fig. 5A

| SAMPLE No. | SORT | MEASUREMENT POINTS | | MEASUREMENT VALUE | TAPER WIDTHS | | DECISION |
|---|---|---|---|---|---|---|---|
| | | X | Y | | LEFT | RIGHT | |
| 001 | LINE | x1 | y1 | Wt | Wt(L) | Wt(R) | OKorNG |

| SAMPLE No. | MEASUREMENT VALUE | DECISION |
|---|---|---|
| 001 | 260.1nm | OK |
| ⋮ | ⋮ | ⋮ |

ALIGNMENT MARK

ENLARGEMENT
LINE
SPACE

TAPER WIDTH (Wt)

10 LINES

METHOD OF DECIDING THE QUALITY OF THE MEASUREMENT VALUE BY THE EDGE WIDTH

BACKGROUND OF THE INVENTION

1. Field of the Invention

The present invention relates to a method of deciding a measurement value, and, more particularly, for deciding the quality of the measurement value obtained by measuring the line width, the line interval or the like of a pattern on an object to-be-measured.

2. Description of the Related Art

Heretofore, an automatic measurement, which is performed with a SEM (scanning electron microscope) for the line width, the line interval or the like of a microscopic pattern that is formed on a mask for transferring the microscopic pattern onto a wafer, has sometimes turned out a failure from various causes. The "failure" termed here signifies that, although a numerical value being the result of the measurement is obtained, the value is incorrect by any cause. In the automatic measurement in the absence of an operator, it is often the case that the cause cannot be easily grasped. This situation occurs for reasons as stated below.

(1) Since the measurement value itself exhibits a variance, a correct value is not fixed.

(2) The measurement value sometimes deviates widely due to the failure of autofocusing in the SEM by any cause, or due to the deviation of an image attributed to charging-up. In some cases, the correct value is obtained by trying the autofocusing again.

(3) A pattern dimension sometimes deviates more than is expected. This dimension is correct as the measurement, and ought to be marked as an abnormal place.

It is required of an automatic measurement apparatus to automatically discriminate these reasons and perform appropriate processing.

An object to be measured here is-a length (width) which is measured along a certain direction (for example, X-direction or Y-direction) in a certain place of the pattern. The pattern is based on a line which has a finite width (including also the interval between lines, and termed "line" or "space"), and a rectangle which occupies a finite area (usually termed "contact hole" or "dot" in the pertinent technical field). In a case where the pattern has a complicated shape, the length (width) to be measured becomes the width of the pattern along a specified line. In case of the contact hole, it is also included to measure the area.

A signal intensity distribution along a designated direction is extracted from the SEM image of the pattern to-be-measured, and both the end edges of the pattern are detected from the signal intensity distribution, so as to calculate the width.

There are several methods for determining the positions of the edges on this occasion.

(1) Threshold value method: In a case where the intensity distribution in the vicinity of each edge is normalized and where the width between the minimum and the maximum is set at 1 (one), the point of an intensity having a threshold value x ($1.0 \geq x \geq 0$) is set as the edge position.

(2) Linear regression method: Regression lines are respectively obtained in a partial intensity distribution near the edge and in a partial intensity distribution near the minimum point, and the intersection point between the regression lines is set as the edge position.

(3) Peak method: A line width is calculated with tentative edges being the peak positions of intensity distributions in the vicinity of the edges, and it is corrected by calibration.

(4) Other (combination): An edge intensity distribution is subjected to a function approximation, and the edge position is determined in combination with the threshold method.

Whether or not the dimension measured by any of the above methods (1) through (3) is correct, has hitherto been decided by either of methods stated below.

(a) A person observes the image of the object to-be-measured, and decides whether or not the measurement proceeded correctly. (Automation is impossible.)

(b) A certain range of measurement values as centers round an expected dimension is set, and any measurement value outside the range is regarded as the failure of the measurement. (Automation is possible.)

Here, the method (a) has had the problems that the automation is impossible, and that individual differences ascribable to the deciders cannot be excluded.

On the other hand, in case of the method (b), the automation is possible, and the predetermined criterion is applied, so that objective data are obtained. This method, however, has had the problem that the simple setting of the range cannot cope with the variance of the object to-be-measured, a systematic change such as process bias, or the like.

SUMMARY OF THE INVENTION

The present invention has been made in order to solve the problems, and it consists in that the quality of a measurement value such as the line width of a pattern is not decided by the measurement value itself, but that the measurement value is decided to be correct, when the taper widths of the signal intensity distributions of the edge parts of the pattern fall within a predetermined range.

It is accordingly permitted to automatically decide the defective measurement of the line width of the pattern, or the like, attributed to an unclear image due to inferior focusing in an image photographing mode, an unclear image due to an image drift ascribable to charging-up, or the like.

The automatic decision facilitates the automatic measurement, and is advantageous for various technical fields requiring measurements.

BRIEF DESCRIPTION OF THE DRAWINGS

FIGS. 5A and 5B show file/display examples in the invention;

DESCRIPTION OF THE PREFERRED EMBODIMENTS

According to the present invention, the quality of a measurement value such as the line width of a pattern is not decided on the basis of the measurement value itself, but the measurement value is decided to be correct, when the taper widths of the signal intensity distributions of the edge parts of the pattern fall within a predetermined range. Thus, it is permitted to automatically decide the defective measurement of the line width of the pattern, or the like, attributed to an unclear image due to inferior focusing in an image photographing mode, an unclear image due to an image drift ascribable to charging-up, or the like.

Figure 1:
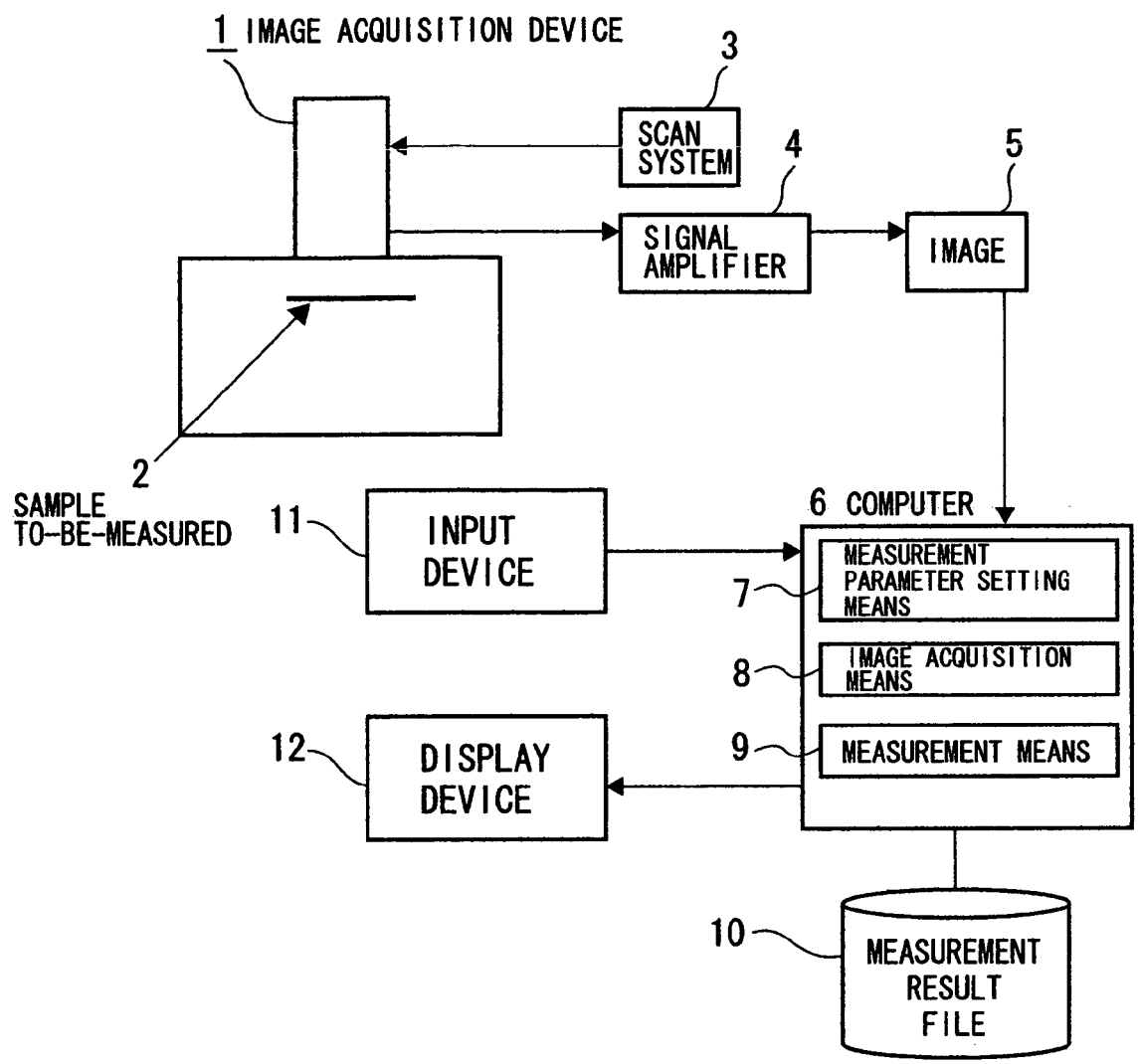
FIG. 1 is a system configuration diagram in the present invention.

FIG. 1 shows a system configuration diagram in the invention.

Referring to FIG. 1, an image acquisition device 1 acquires an image. By way of example, it is a scanning electron microscope (SEM) in which a sample to-be-measured 2 is scanned (as X-scan and Y-scan) with the spot of an accelerated electron beam, and secondary electrons emitted from the sample to-be-measured 2 on that occasion are collected, thereby to generate the image.

The sample to-be-measured 2 is a sample (for example, photomask) which is formed with a pattern, and as to which the line width, line interval, hole size, or the like of the pattern is to be measured.

A scan system 3 is a scan deflection system which X-scans and Y-scans the sample to-be-measured 2 with the spot of the electron beam accelerated by the image acquisition device 1, for example, the scanning electron microscope.

A signal amplifier 4 collects the secondary signal or the likes emitted when the sample to-be-measured 2 is scanned with the electron beam spot, and it amplifies the secondary signal of the emitted electrons or the likes.

An image 5 is obtained in such a way that an analog signal (image signal) amplified by the signal amplifier 4 is converted into a digital image by an A/D converter, so as to store the digital image in a memory.

A computer 6 accepts the digital image 5 and subjects this image to image processing. Here, the computer 6 measures the line width, the line interval, or the like of the pattern of the sample to-be-measured 2 and decides whether or not the resulting measurement value is correct. In the example of FIG. 1, the computer 6 includes measurement parameter setting means 7, image acquisition means 8, measurement means 9, a measurement result file 10, an input device 11 and a display device 12.

The measurement parameter setting means 7 sets various parameters for measuring the line width, or the like of the pattern on the sample to-be-measured 2. Here, it sets the following items as will be exemplified later with reference to FIGS. 6A through 6E:

(1) Coordinates of measurement points: (x, y)
(2) Sorts of measurements:
Line
Space
Hole
Dot
Others
(3) Measurement box:
(4) Template:
(5) Others:

The image acquisition means 8 controls the image acquisition device 1 so as to acquire the digital image 5 of the corresponding place of the sample to-be-measured 2.

The measurement means 9 measures the value of the line width, the line interval, or the like of the pattern on the basis of the digital image 5 acquired by the image acquisition means 8. In addition, it obtains the taper widths of edge parts at the measurement, so as to decide the measurement value as being correct when the taper widths fall within a predetermined range, and as being defective when they fall outside the predetermined range (as will be described later with reference to FIG. 2-FIG. 8).

The measurement result file 10 stores therein the measurement value of the line width, the line interval, or the like of the pattern designated on the basis of the image 5, and the propriety of the measurement value as decided on the basis of the taper widths (refer to FIGS. 5A and 5B).

The input device 11 is used for inputting various instructions and data, and it is, for example, a keyboard or a mouse.

The display device 12 displays the image, the measurement result, etc.

Next, the general operation of the configuration in FIG. 1 will be described in detail with reference to the flow chart of FIG. 2.

Figure 2:
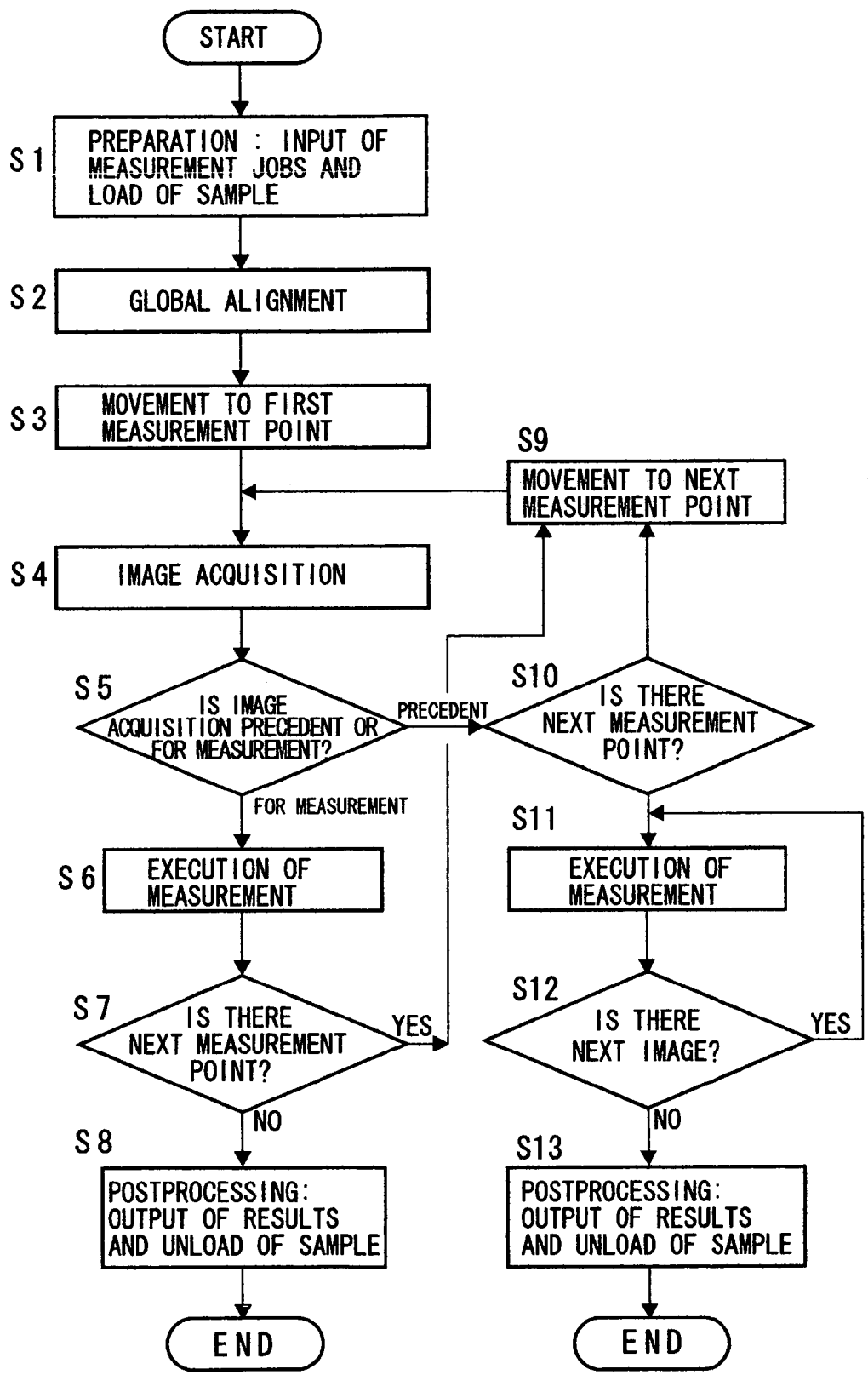
FIG. 2 is a flow chart (general) for explaining an operation in the invention.

FIG. 2 shows the flow chart (general) for explaining the operation in the invention.

Referring to FIG. 2, a step S1 is a preparation step, which inputs measurement jobs and loads a sample. More specifically, the following items are designated and input as the measurement jobs of patterns on the sample to-be-measured 2:

(1) Coordinates of measurement points: (x, y)
(2) Sorts of measurements:
Line
Space
Hole
Dot
Others
(3) Measurement box:
(4) Template:

and the sample to-be-measured 2 is loaded (or set) in the image acquisition device 1. Here, (1) the coordinates of measurement points are the coordinates (X, Y) of the positions of patterns to be measured on the sample to-be-measured 2 (coordinates on the sample to-be-measured 2, or positions (points) of the patterns to-be-measured on CAD data). (2) The sorts of measurements are a line (a line width), a space (the interval between lines), a hole (the distance between opposite latera inside a rectangle), and a dot (the distance between opposite latera outside a rectangle) which correspond to the measurement point coordinates designated as the measurement job (1). (3) A measurement box is a rectangle within which a predetermined number of lines (line widths) are to be measured. (4) A template (bitmap) is used for performing pattern matching on an image, as to the patterns to-be-measured on CAD, so as to perform the measurement as to the pattern having matched.

A step S2 performs a global alignment. This step determines the transform formula (determinant) between the coordinate system of the image and a coordinate system on the CAD data, on the basis of a plurality of alignment marks on the image of the sample to-be-measured 2 loaded in the image acquisition device 1. Thenceforth, ordinarily the coordinates of positions on the CAD data are transformed into the coordinate system on the image, by the transform formula and in accordance with the positions (center positions) of the pattern to-be-measured on the CAD data, the sort of the measurement, etc., and stages are moved to move the sample to-be-measured 2 to a predetermined position, whereupon an image is acquired.

A step S3 moves the sample to-be-measured 2 to a first measurement point. This step moves the sample to-be-measured 2 to the first measurement point designated at the step S1. Concretely, the designated first measurement point on the CAD data is transformed into the measurement point on the image by the determinant, and the sample to-be-measured 2 is moved by the unshown stages (X, Y) of the image acquisition device 1 so that the measurement point after the transform may lie substantially centrally of the image.

A step S4 acquires the image. At this step, the scan system 3 of the image acquisition device 1 performs the plane scan of the sample to-be-measured 2 with the electron beam spot, the signal of the secondary electrons emitted on that occasion is detected and amplified by the signal amplifier 4, the digital image 5 is generated, and the image acquisition means 8 of the computer 6 accepts the digital image.

A step S5 discriminates whether the image acquisition is precedent or for the measurement. In a case where the image acquisition is precedent, the routine proceeds to a step S10. On the other hand, in a case where the image acquisition is for the measurement, the routine proceeds to a step S6.

At the step S10, since the precedent image acquisition has been found (it has been found that the precedent image acquisition is previously designated), if the next measurement point exists is discriminated. In the existence of the next measurement point, the sample to-be-measured 2 is moved to this next measurement point at a step S9 so as to repeat the step S4, et seq. In the nonexistence of the next measurement point, the measurement is executed at a step S11 (as will be explained later with reference to FIG. 3). Further, if the next image exists is discriminated at a step S12. In the existence of the next image, the step S11 is repeated, and in the nonexistence thereof, a step S13 executes postprocessing at which a result is output, and the sample is unloaded (the sample to-be-measured 2 is removed out of the image acquisition device 1).

At the step S6, since the image acquisition has been found to be for the measurement (it has been found that the measurement is previously designated), the measurement is executed (as will be explained later with reference to FIG. 3). Further, if the next measurement point exists is discriminated at a step S7. In the existence of the next measurement point, the sample to-be-measured 2 is moved to the next measurement point at the step S9 so as to repeat the step S4, et seq. On the other hand, in the nonexistence of the next measurement point, a step S8 executes postprocessing at which a result is output, and the sample is unloaded (the sample to-be-measured 2 is removed out of the image acquisition device 1).

As thus far described, the measurement result (measurement value, and a distinction as to whether the measurement value is correct or defective) can be automatically output in such a way that the measurement jobs (parameters (1) through (4)) are set, that the sample to-be-measured 2 is loaded, that the determinant for transforming the coordinate system of the image and that of the CAD data is calculated on the basis of the image of the plurality of alignment marks of the sample to-be-measured 2, that the sample to-be-measured 2 is thereafter moved to the designated measurement points so as to acquire the image, that the edge positions of the measurement points are found on the basis of the acquired image, while taper widths are simultaneously obtained, and that the measurement value of a line width or the like calculated from the edge positions is decided to be correct when the taper widths have fallen within a predetermined range. Now, the processing steps will be successively described in detail.

Figure 3:
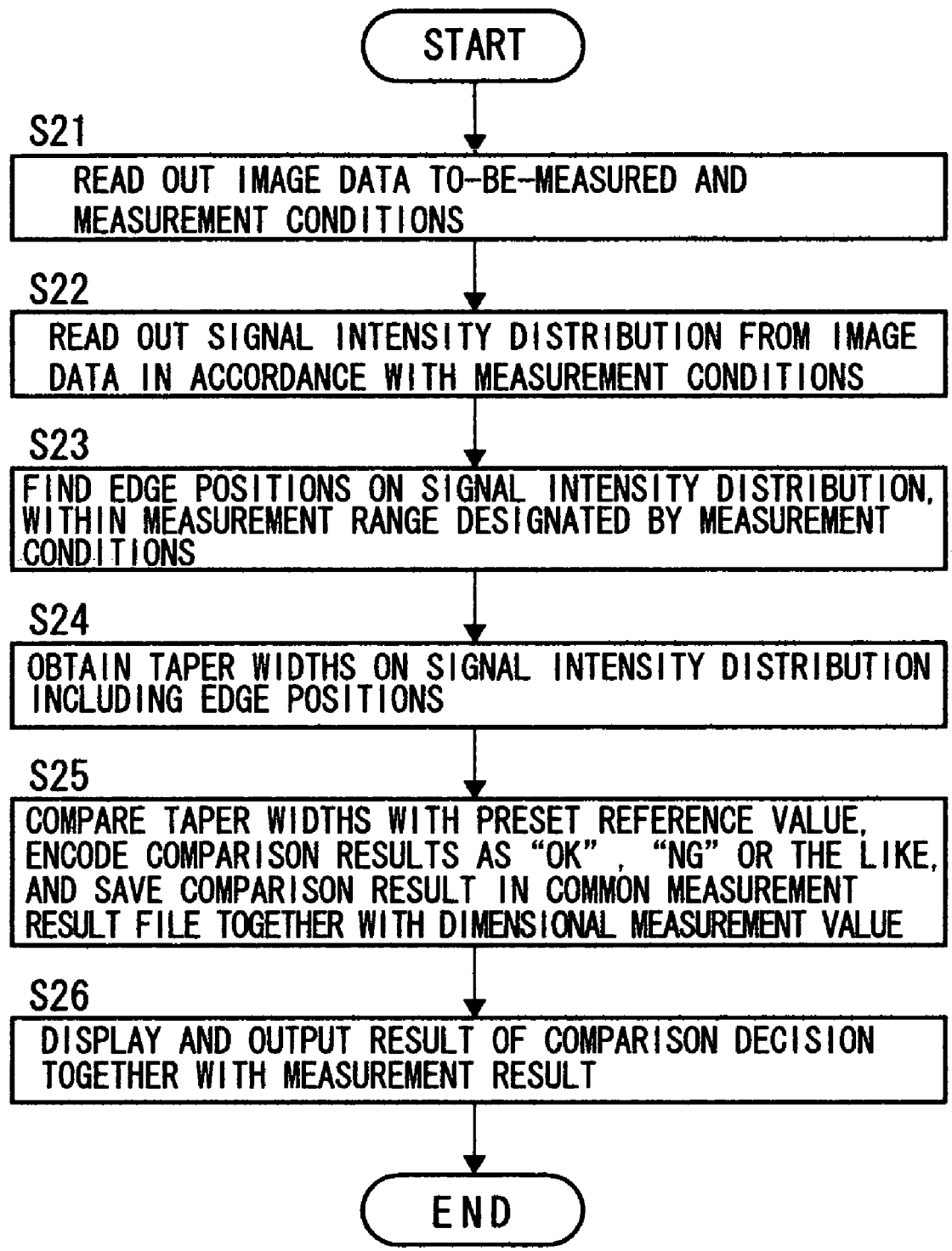
FIG. 3 is a flow chart (measurement) for explaining an operation in the invention.

FIG. 3 shows a flow chart for explaining an operation in the invention (measurement). This figure shows the detailed flow chart of the measurement execution at the step S6 or S11 in FIG. 2 as already stated.

Referring to FIG. 3, a step S21 reads out image data to-be-measured and measurement conditions. At this step, the image acquisition means 8 in FIG. 1 reads out the image data (image 5) and also reads out the input (designated) measurement conditions (the measurement conditions (1) through (4) already stated).

A step S22 reads out a signal intensity distribution from the image data in accordance with the measurement conditions. At this step, the signal intensity distribution of, for example, a line which passes through designated measurement points, among the measurement conditions read out at the step S21, is read out (refer to a signal intensity distribution at (a-2) in FIG. 4A).

A step S23 finds edge positions on the signal intensity distribution, within a measurement range designated by the measurement conditions. At this step, by way of example, on the image of each edge part of a distribution variation (a-3) in FIG. 4A, the value xe ($=$(xp1−xp2)/2) between the value xp1 of the maximum peak P1 and the value xp2 of the minimum peak P2 is found as the edge position as shown in FIG. 4B.

A step S24 obtains a taper width on the signal intensity distribution including the edge position. At this step, by way of example, on the image of each edge part of the distribution variation (a-3) in FIG. 4A, the difference between the value xp1 of the maximum peak P1 and the value xp2 of the minimum peak P2 is obtained as the taper width xt ($=$xp1−xp2) as shown in FIG. 4B.

A step S25 compares the taper width with a preset reference value and encodes a comparison result as "OK", "NG" or the like, and it saves the result in a common measurement result file together with a dimensional measurement value. At this step, when the taper width xt obtained at the step S24 falls within a range experimentally obtained beforehand, for example, a taper width range of 22 nm-33 nm in FIG. 4C, "OK" is decided, and when not, "NG" is decided. Also, the decided comparison result is saved in the measurement result file shown in FIG. 5A to be explained later, together with the line width calculated from the edge position found at the step S23.

A step S26 displays and outputs the result of the comparison result together with the measurement result. By way of example, the measurement result (the measurement value of the line width or the like) and the decision result ("OK" or "NG") are displayed together as shown in FIG. 5B to be referred to later.

Figure 4A:
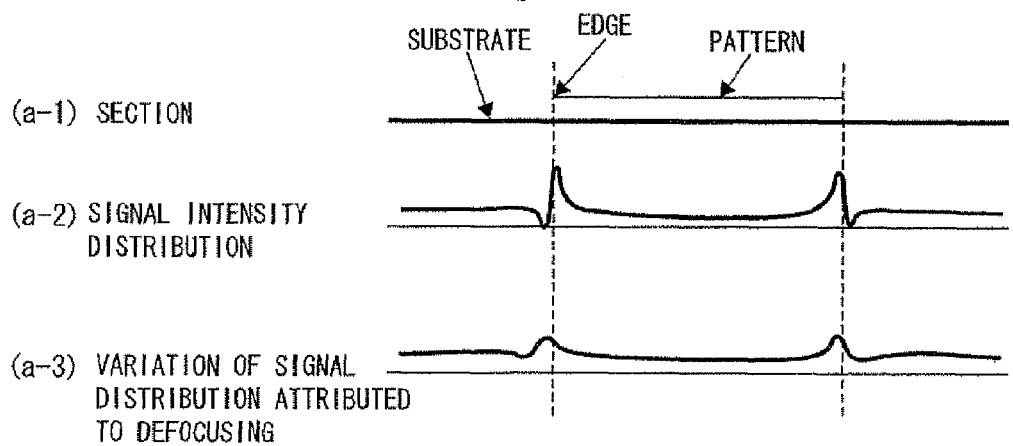
FIGS. 4A through 4C are explanatory diagrams (I) of the invention.
Figure 4B:
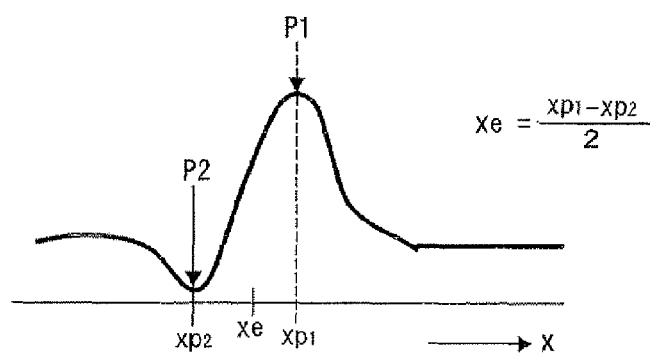

Owing to the above, it can be automatically performed that the signal intensity distribution ((a-2) in FIG. 4A) is generated on the basis of the image to-be-measured and the measurement conditions, that the maximum peak P1 and minimum peak P2 of the edge part are found on the generated signal intensity distribution so as to obtain the edge position xe and the taper width xt therefrom, that the taper width is decided as "OK" when it falls within the predetermined range set beforehand and as "NG" when not, and that the decision result and the line width or the like measurement value calculated from the edge positions are saved and displayed together.

Figure 4C:
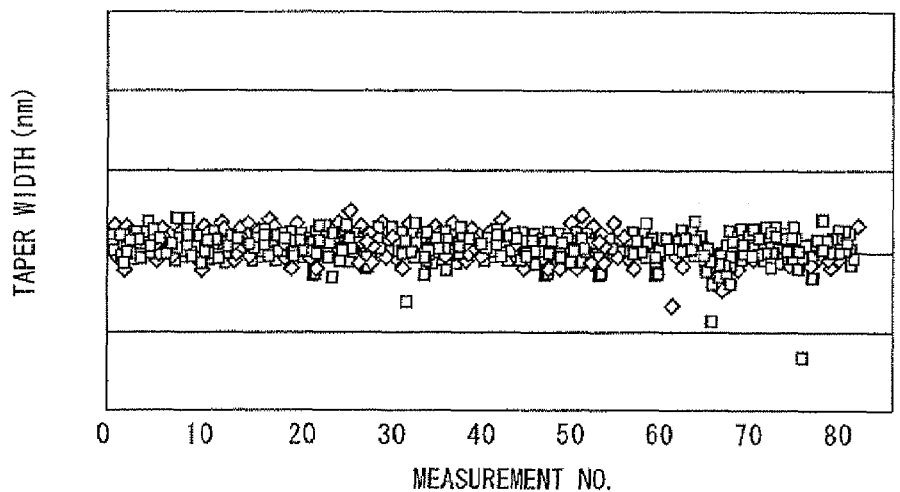

FIGS. 4A-4C show the explanatory diagrams (I) of the invention.

(a-1) in FIG. 4A indicates an example of a pattern on the sample to-be-measured 2. This example is an example of the pattern formed on the sample to-be-measured 2 in FIG. 1.

Here, a convex pattern which is formed on a substrate (a pattern which crosses a line from this side toward the opposite side).

(a–2) in FIG. 4A indicates an example of the normal-mode waveform of the signal intensity distribution of the pattern (a–1) in FIG. 4A. Here, the example is the signal intensity distribution of a part corresponding to the pattern (a–1) in FIG. 4A, in the image 5 which is generated in such a way that this pattern (a–1) is scanned in a right and left direction as viewed in FIG. 4A, with the spot of the accelerated electron beam, and that the secondary electrons emitted then are collected, detected and amplified. That is, the signal intensity distribution becomes a distribution in which the upward maximum peak P1 and the downward minimum peak P2 appear at each edge part of the pattern as shown in FIGS. 4A and 4B (a well-known peculiar distribution which is based on the detection of the secondary electrons emitted from the pattern). The exemplified distribution corresponds to a case where the electron beam spot is precisely focused on the pattern and where no drift arises during the scanning projection of the electron beam spot in the right and left direction, so that the decision of the measurement value to be explained later becomes "OK". On this occasion, when the left edge part of the pattern is enlarged, the signal intensity distribution shown in FIG. 4B is exhibited.

(a–3) in FIG. 4A indicates an example of the variation of the signal intensity distribution attributed to defocusing, in the pattern (a–1) in FIG. 4A. This example is the signal intensity distribution of the part corresponding to the pattern (a–1) in FIG. 4A, in the image 5 which is generated in such a way that this pattern (a–1) is scanned in the right and left direction with the defocusing and large-sized spot of the accelerated electron beam, and that the secondary electrons emitted then are collected, detected and amplified. In the defocusing condition here, the upward maximum peak P1 and the downward minimum peak P2 of each edge part of the pattern are gentle, and their positions deviate (with the result that the measurement value becomes inaccurate). In this case, the taper width in FIG. 4C to be explained later falls outside the predetermined range, and the measurement value is decided as "NG".

FIG. 4B shows the enlarged diagram of the edge part. This figure corresponds to the left edge part of the signal intensity distribution (a–2) in FIG. 4A. Here, letting xp1 denote the position of the maximum peak P1, and xp2 denote the position of the minimum peak P2, the following items are defined:

Edge position $xe=(xp1-xp2)/2$

Taper width=$(xp1-xp2)$

Likewise, the edge position and the taper width are measured for the right edge part of the distribution (a–2) in FIG. 4A. Besides, the width of the pattern (the line width) is the interval (difference) between the two edge positions, and the taper widths become the two, left and right taper widths.

FIG. 4C shows an example of the distribution of line edge taper widths. This example has been obtained by actually measuring a line pattern on a photomask, and then calculating and plotting the taper widths of edges. In the example, lines whose line widths were 160 nm-600 nm and which totaled 900 were measured, and the differences (intervals) between the positions of the maximum peaks P1 and the minimum peaks P2 were calculated. As understood from FIG. 4C, the taper widths fall within a range of 22 nm-33 nm, that is, within substantially ±5 nm. Only three points in the figure fall outside the range, and the measurement values of these points are ascribable to the variations (deviations) of the signal intensity distributions of the corresponding edge parts as caused by the blurring of the edge parts (refer to the distribution variation (a–3) in FIG. 4A) attributed to defocusing or drift.

Accordingly, the quality of the measurement value is not decided by the measurement value itself, but when the taper widths of the edge parts fall within the predetermined range (within the range of 22 nm-33 nm in the example of FIG. 4C), it can be decided that neither the defocusing nor the drift exists, and that the signal intensity distribution is normal, and the measurement value calculated on the basis of the edge positions on that occasion can be decided as being normal or "OK".

FIGS. 5A and 5B show file/display examples in the invention.

FIG. 5A exemplifies the measurement result file. This file is the measurement result file 10 (FIG. 1) in which a measurement result and a decision result are saved at the step S25 in FIG. 3 as already stated, and in which the following information items indicated in FIG. 5A are saved in association:

Sample No.:
Sort:
Measurement points:
X
Y
Measurement value Wt:
Taper widths:
Left Wt(L)
Right Wt(R)
Decision ("OK" or "NG"):
Others:

Here, the "Sample No." is the unique No. of the sample to-be-measured 2. The "Sort" is the sort of the measurement, such as line, space, hole or dot. The "Measurement points" indicate point coordinates which are designated for the measurement. The "Measurement value Wt" is the measurement value such as measured line width or line interval. The "Taper widths" are the taper widths of the edge parts (refer to FIG. 4B). The "Decision" is set as "OK" when the taper width falls within the predetermined range, and as "NG" when the taper width falls outside the predetermined range.

FIG. 5B exemplifies the result display. The results saved in the measurement result file 10 in FIG. 5A are displayed, and here, the "Sample No.", "Measurement value" and "Decision" are list-displayed in association.

As stated above, the decision (based on the taper widths) is conjointly displayed in association with the measurement value, whereby the measurement value can be decided and displayed as "NG" when the taper width has changed and fallen outside the predetermined range due to the defocusing or drift, without resorting to the measurement value itself.

FIGS. 6A through 6E are the explanatory diagrams (II) of the invention.

Figure 6A:
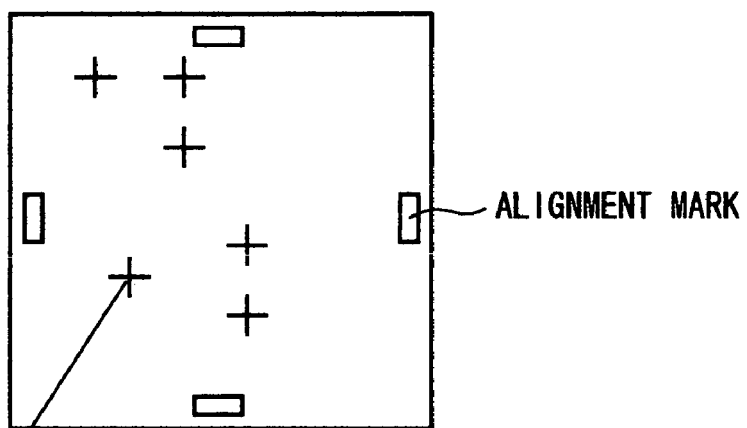
FIGS. 6A through 6E are explanatory diagrams (II) of the invention.

FIG. 6A shows an example of the designation of measurement points. Here, a situation where the measurement points on the sample to-be-measured 2 are designated is shown (designated on CAD data).

Figure 6B:
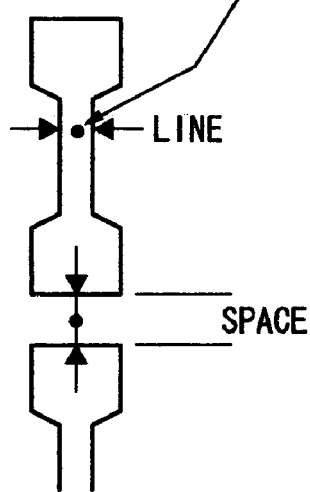

FIG. 6B shows a situation where the points designated in FIG. 6A are enlarged. Here, the point for measuring the width of the line of wiring (the point and the line) is (are) designated. Also, the point for designating the interval between lines (the point and the space) is (are) exemplified at a lower part.

Figure 6C:
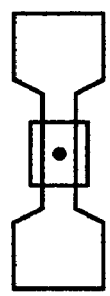

FIG. 6C shows a situation where the point designated in FIG. 6A is enlarged. Here, the point for measuring the widths of a plurality of lines within a rectangle (the point and the box (its width and height)) is (are) designated.

Figure 6D:
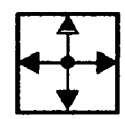

FIG. 6D shows a situation where the point designated in FIG. 6A is enlarged. Here, the point for measuring vertical and lateral widths inside a rectangle (the point and a hole) is (are) designated.

Figure 6E:
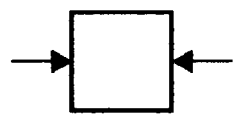

FIG. 6E shows a situation where the point designated in FIG. 6A is enlarged. Here, the point for measuring a lateral width outside a rectangle (the point and a dot) is (are) designated.

FIGS. 7A through 7D are the explanatory diagrams (III) of the invention.

Figure 7A:
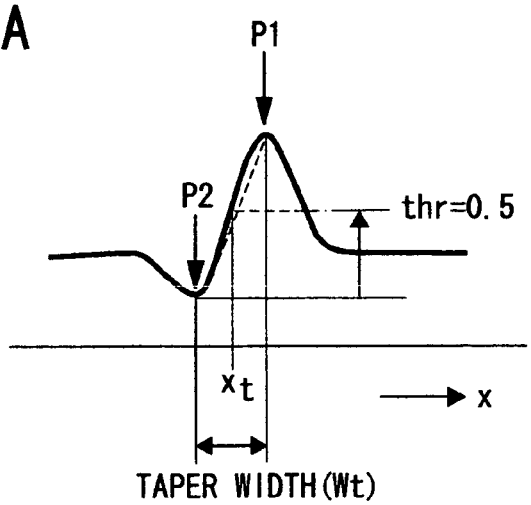
FIGS. 7A through 7D are explanatory diagrams (III) of the invention.

FIG. 7A exemplifies a taper width and an edge position. This example is the same as the example shown in FIG. 4B already stated, and it shows the signal intensity waveform of the left edge part of the pattern. The interval between the position of the maximum peak P1 and that of the minimum peak P2 corresponds to the taper width Wt, and the position of the intermediate point between the position of the maximum peak P1 and that of the minimum peak P2 (the point whose "thr" (threshold value) becomes 0.5 through a rectilinear approximation) corresponds to the edge position xt.

Figure 7B:
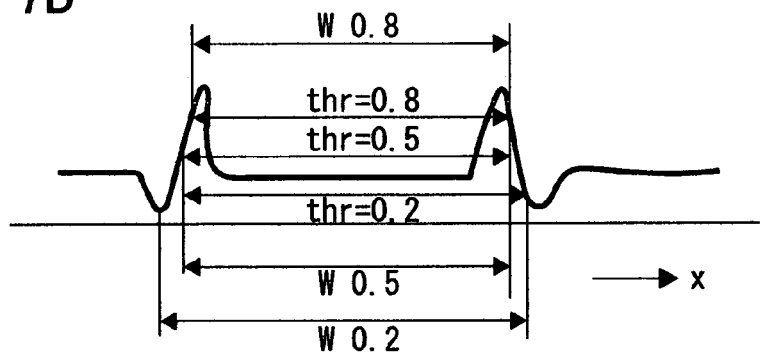

FIG. 7B shows examples of the "thr" (threshold value) and the width (measurement value) corresponding thereto. The line widths W0.2, W0.5 and W0.8 between the left edge parts and right edge parts of the pattern correspond to the illustrated threshold values ("thr")=0.2, 0.5 and 0.8, respectively. Which of the line widths is to be adopted, is determined by experimentally measuring the line width of the pattern. Usually, the measurement value (line width) W0.5 corresponding to thr=0.5 is used.

Figure 7C:
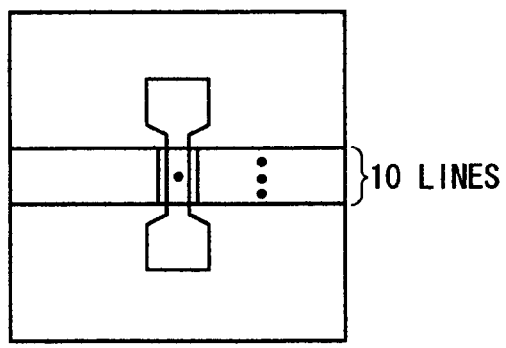

FIG. 7C shows a measurement example of a box. Assuming that a rectangle as shown in the figure have been designated by a point and the box (its vertical and lateral dimensions), line widths (for example, W0.5 corresponding to thr (threshold value)=0.5 in FIG. 7B) are respectively measured for a designated number of (for example, ten) lines (for example, equiinterval lines) inside the designated rectangle.

Figure 7D:
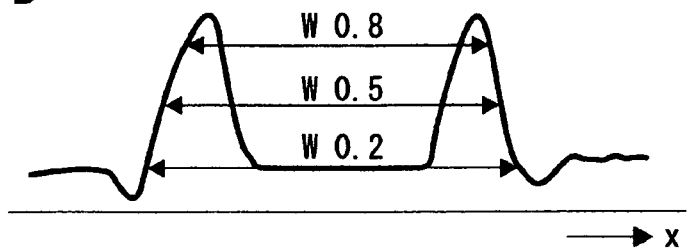

FIG. 7D exemplifies taper widths. Here, the taper widths W0.2, W0.5 and W0.8 between the left edge parts and right edge parts of a pattern corresponding to threshold values (thr)=0.2, 0.5 and 0.8 are measured, respectively. Besides, the following items are set:

Taper width=$(W0.8-W0.2)/2$

Measurement value (Line width)=$W0.5$

In this way, the values (distances) between the left and right edge parts of the pattern for the three different threshold values (thr) are measured, and the taper width and the measurement value (line width or the like) can be calculated from the measured values.

Figure 8:
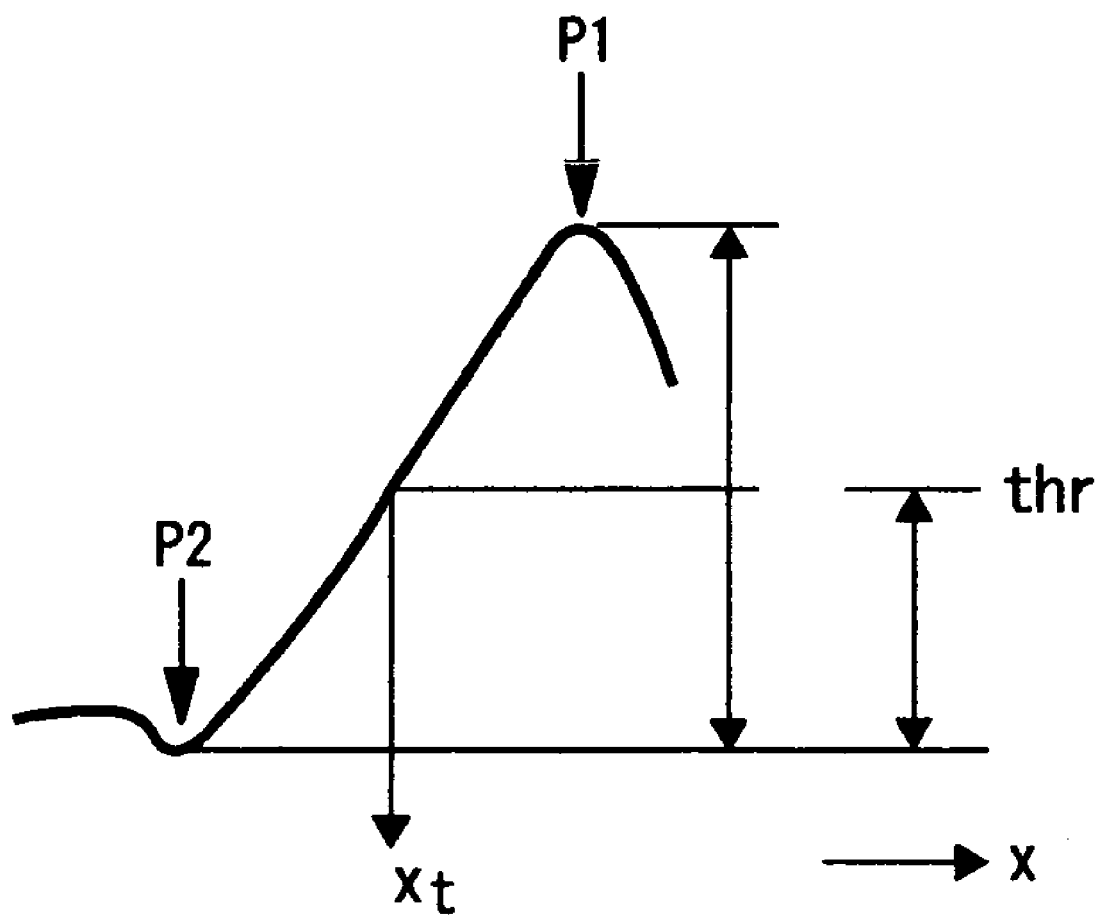
FIG. 8 is an explanatory diagram (IV) of the invention.

FIG. 8 is the explanatory diagram (IV) of the invention. This figure elucidates a linear regression method. Here, the signal intensity distribution of the left edge part of a pattern is extracted by way of example, and a predetermined number of data items are extracted from between the maximum peak P1 and minimum peak P2 of the edge part, as:

Data $i(n)=i(xn)$

Besides, coefficients $\alpha$ and $x0$ affording $\alpha(x-x0)$ are determined by the known method of least squares. In addition, the following expressions are obtained:

$Ip1=\alpha(xp1-x0)$ $Ip2=\alpha(xp2-x0)$ $It=thr(Ip1-Ip2)+Ip2=\alpha(xt-x0)$

Therefore, "xt" among the terms is obtained, and a line width or the like measurement value is calculated on the basis of the term "xt" (edge position).

Besides, a taper width is calculated as the taper width=$|xp1-xp2|$.

Figure 9:
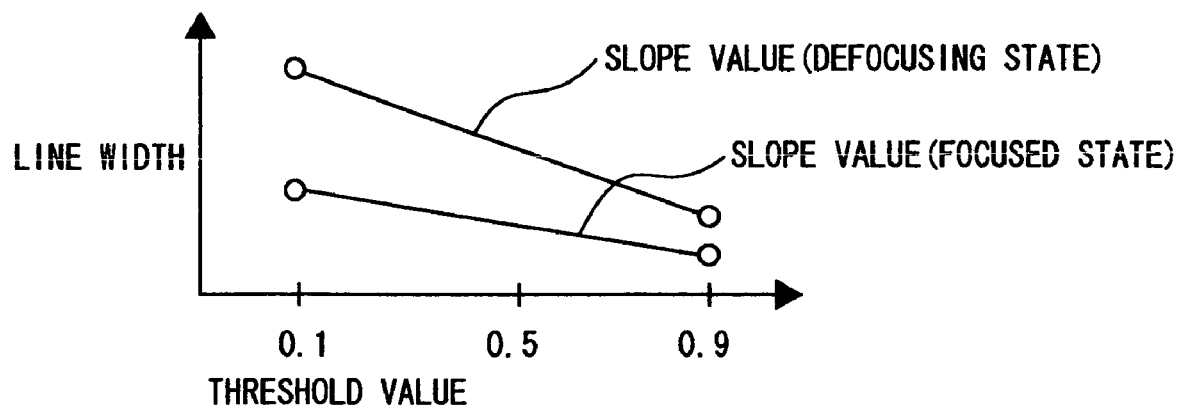
FIG. 9 is an explanatory diagram (slope value) of the invention.

FIG. 9 is the explanatory diagram (slope value) of the invention.

Referring to FIG. 9, the axis of abscissas represents a predetermined threshold value for measuring the line width of a pattern, while the axis of ordinates represents the line width of the pattern (the line width between threshold values). The slope value is the segment of a line (segment having a slope) obtained by plotting line widths at different threshold values, and it is revealed that the line width of the pattern narrows as the threshold value enlarges. Here, in a state where the beam spot of a SEM for measuring a length is focused on a sample to-be-measured (for example, a pattern to-be-measured on a mask), the slope value becomes as shown at the lower stage of the figure, and the whole slope becomes gentle. In contrast, in a defocusing state, the slope value becomes as shown at the upper stage of the figure, and the whole slope becomes steep.

Accordingly, when the line widths at the different threshold values are plotted as shown in FIG. 9, either the focused state or the defocusing state can be displayed so as to be easily understood, and the focused and defocusing states can be automatically decided by comparing them with values experimentally obtained beforehand.

Figure 10:
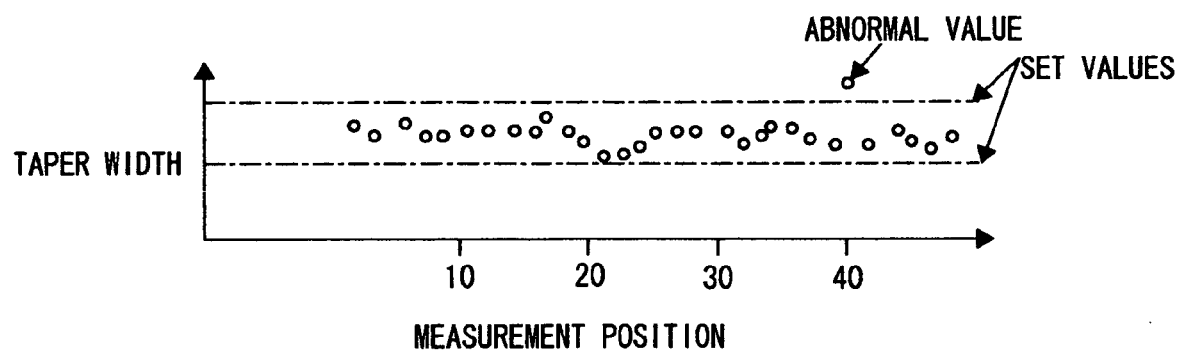
FIG. 10 is an explanatory diagram (taper value) of the invention.

FIG. 10 is an explanatory diagram (taper width) of the invention.

Referring to FIG. 10, the axis of abscissas represents the measurement position of a pattern, while the axis of ordinates represents the taper width. The figure shows a situation where the taper widths (refer to, for example, FIG. 7A already stated) are plotted in association with the measurement positions of the pattern. Measurement data as to which the taper widths fall within a predetermined range (within a normal range experimentally set beforehand) are decided to be correct, and the other measurement data are decided to be incorrect.

Accordingly, when the taper widths are plotted in association with the measurement positions of the pattern as shown in FIG. 10, it can be automatically decided that the measurement data whose taper widths fall within the predetermined range are correct, whereas the other measurement data are incorrect.

Figure 11A:
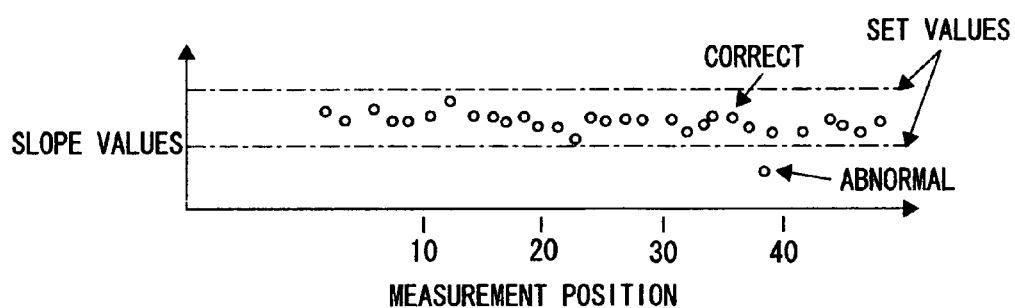
FIGS. 11A and 11B are explanatory diagrams (slope value) of the invention.
Figure 11B:
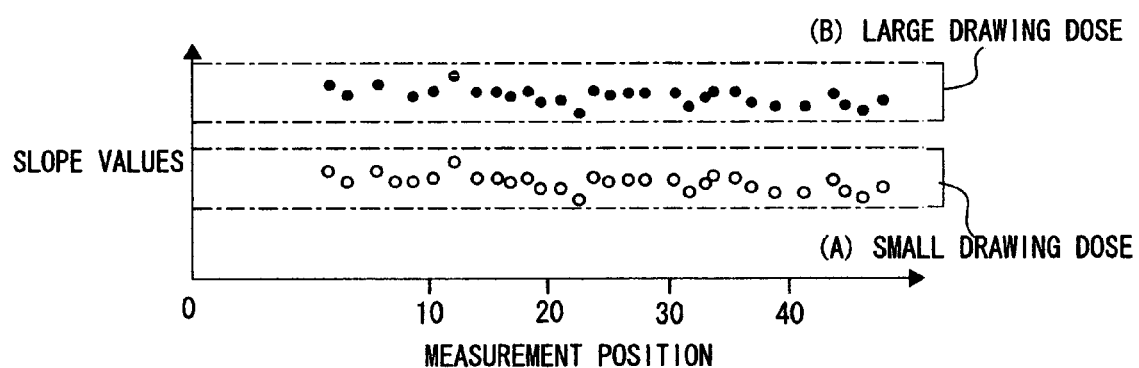

FIGS. 11A and 11B are explanatory diagrams (slope value) of the invention. The "slope value" is a value which is obtained in such a way that the difference between the values of the line widths of a pattern at two desired threshold values is divided by the difference between the threshold values. By way of example, it is calculated by the following formula (although the threshold values may be as desired, they are exemplified to be 0.9 and 0.1 here):

Slope value=((pattern width at threshold value of 0.9)−(pattern width at threshold value of 0.1))/(0.9−0.1)

The slope value enlarges as the spot of a beam which is projected on the pattern of a mask defocuses (the slope value enlarges from the focused state toward the defocusing state as shown in FIG. 9). The slope value becomes different, not only due to defocusing, but also in accordance with the drawing condition of an electron beam during the formation of the pattern to-be-measured of a mask, so that the influence of the drawing condition can also be assessed.

FIG. 11A shows an example in which slope values are plotted in association with the measurement positions of a pattern. Here, it can be automatically decided that measurement data are correct when the slope values fall within the range of set values (experimentally obtained values) of dot-and-dash lines indicated, whereas measurement data are abnormal when the slope values fall outside the range.

FIG. 11B shows an example in which slope values in the case of a small drawing dose and in the case of a large drawing dose are plotted. The upper stage of the figure indicates the plots of the slope values versus measurement value, in the case where the dose for drawing the pattern is large, and measurement data inside a-set value-range are decided to be correct, whereas measurement data outside the set value range are decided to be incorrect. Besides, the lower stage of the figure indicates the plots of the slope values versus measurement value, in the case where the dose for drawing the pattern is small, and measurement data inside a set value range are decided to be correct, whereas measurement data outside the set value range are decided to be incorrect.

As described above and as shown in FIG. 11B, the range of the correct slope values differs depending upon the condition for drawing the pattern (drawing condition), here upon the dose of the electron beam in the drawing. Therefore, when set values (experimentally obtained beforehand) are given in association with the drawing condition or the like, whether measurement data are correct or incorrect can be automatically decided.

The invention consists in a method of deciding a measurement value in which the quality of the measurement value such as the line width of a pattern is not decided on the basis of the measurement value itself, but the measurement value is decided to be correct, when the taper widths of the signal intensity distributions of the edge parts of the pattern fall within a predetermined range. Accordingly, it is applicable to extensive technical fields including semiconductor industries.

What is claimed is:

1. A method of deciding a quality of a measurement value of a line width or a line interval of a pattern on an object to-be-measured, the method comprising:
   acquiring a signal intensity distribution of the pattern on the object to-be-measured;
   detecting edge positions of the pattern from the acquired signal intensity distribution;
   detecting taper widths of edge parts of the pattern from the acquired signal intensity distribution; and
   deciding that a measurement value calculated on the basis of the detected edge positions is correct, when the detected taper widths fall within a predetermined range, and that the measurement value calculated on the basis of the detected edge positions is defective, when the detected taper widths fall outside the predetermined range.

2. The method of claim 1, wherein each of the taper widths is a width between a maximum peak value P1 and a minimum peak value P2 which correspond to the edge parts of the pattern from the acquired signal intensity distribution.

3. The method of claim 1, wherein each of the taper widths is a width between two threshold values which are previously set between a maximum peak value P1 and a minimum peak value P2 corresponding to the edge parts of the pattern from the acquired signal intensity distribution.

4. The method of claim 3, wherein each of the edge positions of the pattern is a position between two threshold values which are previously set between a maximum peak value P1 and a minimum peak value P2 corresponding to the edge parts of the pattern from the acquired signal intensity distribution.

5. The method of claim 3, wherein each of the edge positions of the pattern is found by a linear regression method on the basis of a predetermined number of values between a maximum peak value P1 and a minimum peak value P2 which correspond to the edge parts of the pattern from the acquired signal intensity distribution.

6. The method of claim 5, wherein the signal intensity distribution of the pattern is a signal intensity distribution which is generated by detecting secondary electrons emitted from the pattern on the object to-be-measured.

7. The method of claim 6, wherein the measurement value calculated on the basis of the detected edge positions is output together with a result of the decision as to whether the measurement value is correct or defective.

8. The method of claim 7, wherein the signal intensity distribution is at least one signal intensity distribution which has been obtained by scanning the object to-be-measured with an electron beam spot.

9. The method of claim 7, wherein the values of the taper widths or the slope values corresponding to a position of the pattern are output together.

10. The method of claim 9, wherein the values of the taper widths or the slope values are output along with creation conditions or drawing conditions of the pattern.

11. The method of claim 1, wherein each of the edge positions of the pattern is a position between a maximum peak value P1 and a minimum peak value P2 which correspond to the edge parts of the pattern from the acquired signal intensity distribution.

* * * * *

UNITED STATES PATENT AND TRADEMARK OFFICE
CERTIFICATE OF CORRECTION

| | | |
|---|---|---|
| PATENT NO. | : 7,409,309 B2 | Page 1 of 1 |
| APPLICATION NO. | : 11/270813 | |
| DATED | : August 5, 2008 | |
| INVENTOR(S) | : Jun Nitta et al. | |

It is certified that error appears in the above-identified patent and that said Letters Patent is hereby corrected as shown below:

Column 12, Line 38, in claim 9, after "or" delete "the".

Signed and Sealed this

Eleventh Day of November, 2008

JON W. DUDAS
*Director of the United States Patent and Trademark Office*